United States Patent
Jiang et al.

(10) Patent No.: US 9,290,378 B2
(45) Date of Patent: Mar. 22, 2016

(54) MEMS CAPPING METHOD

(71) Applicant: SEMICONDUCTOR MANUFACTURING INTERNATIONAL (SHANGHAI) CORPORATION, Shanghai (CN)

(72) Inventors: Lushan Jiang, Shanghai (CN); Xiaojun Chen, Shanghai (CN); Xuanjie Liu, Shanghai (CN); Liangliang Guo, Shanghai (CN); Junde Ma, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/592,873

(22) Filed: Jan. 8, 2015

(65) Prior Publication Data

US 2015/0298968 A1    Oct. 22, 2015

(30) Foreign Application Priority Data

Apr. 21, 2014 (CN) .......................... 2014 1 0160674

(51) Int. Cl.
*B81C 1/00* (2006.01)
*B81B 7/00* (2006.01)

(52) U.S. Cl.
CPC ........... *B81C 1/00269* (2013.01); *B81B 7/0058* (2013.01); *B81C 1/00825* (2013.01)

(58) Field of Classification Search
CPC .................................................. B81B 7/0058
See application file for complete search history.

(56) References Cited

U.S. PATENT DOCUMENTS

| | | | | |
|---|---|---|---|---|
| 8,188,799 B2* | 5/2012 | Baik | ................... | B81C 1/00063 331/96 |
| 2006/0208326 A1* | 9/2006 | Nasiri | ................. | B81C 1/00238 257/414 |
| 2006/0220223 A1* | 10/2006 | Lu | ........................ | B81C 1/00269 257/704 |
| 2008/0283990 A1* | 11/2008 | Nasiri | ................. | B81C 1/00238 257/684 |
| 2011/0049652 A1* | 3/2011 | Wu | ...................... | B81C 1/00246 257/417 |
| 2011/0233621 A1* | 9/2011 | Liu | ...................... | B81C 1/00269 257/254 |
| 2012/0091511 A1* | 4/2012 | Chen | ................... | H01L 21/3086 257/213 |
| 2013/0187245 A1* | 7/2013 | Chien | ................. | B81C 1/00269 257/415 |
| 2014/0104687 A1* | 4/2014 | Warashina | ......... | G01B 9/02051 359/580 |
| 2014/0110800 A1* | 4/2014 | Classen | ................. | B81B 7/0058 257/415 |
| 2014/0138853 A1* | 5/2014 | Liu | ...................... | B81C 1/00269 257/777 |
| 2015/0210537 A1* | 7/2015 | Chang | ................... | B81B 3/0051 257/704 |

* cited by examiner

*Primary Examiner* — Jerome Jackson, Jr.
*Assistant Examiner* — Ankush Singal
(74) *Attorney, Agent, or Firm* — Kilpatrick Townsend & Stockton LLP

(57) ABSTRACT

A method for fabricating a MEMS device includes providing a substrate having a front surface and a back surface, and forming a protruding engagement member on the front surface of the substrate. The protruding engagement member has an inner periphery defining a groove and an outer periphery. The method also includes forming a first trench having a first depth along the outer periphery, forming a patterned mask layer on the protruding engagement member covering the groove and exposing a portion of the first trench. The method further includes etching the exposed portion of the first trench to form a second trench having a second depth, removing the patterned mask layer, bonding the substrate with a MEMS substrate to form the MEMS device, and thinning the back surface to within the second depth. The method prevents dust from being deposited on the MEMS substrate as in the case of cutting.

16 Claims, 6 Drawing Sheets

MEMS CAPPING METHOD

CROSS-REFERENCES TO RELATED APPLICATIONS

This application claims priority to Chinese patent application No. 201410160674.8, filed on Apr. 21, 2014, the content of which is incorporated herein by reference in its entirety.

BACKGROUND OF THE INVENTION

The present invention relates to semiconductor manufacturing technology, and more particularly to MEMS devices and a method of manufacturing such MEMS devices.

With the continuous development of semiconductor technology, integrated CMOS devices and micro-electromechanical system (MEMS) devices have increasingly become the main stream and the most advanced technology in the market of sensors (motion sensors). With the technological advance, such motion sensors are getting smaller and have high electrical performance with reduced wear and tear.

Conventional process steps of manufacturing a MEMS device are shown in FIGS. 1A, 1B and 2A through 2C. As shown in FIG. 2A, a conventional manufacturing process step may start with separately providing a MEMS substrate 101 and a cover layer 102. The MEMS substrate may have multiple sensor devices and aluminum pads, which will be used to encapsulate the MEMS device.

Next, the MEMS substrate 101 and the cover layer 102 are bonded together to form the MEMS device, as shown in FIG. 1A and FIG. 2B.

Thereafter, the covering layer 102 is submitted to scribing and cutting (blade dicing) to reduce the size of the covering layer 102 and expose the bonded substrate, as shown in FIG. 1B and FIG. 2C.

Cutting the cover layer with a dicing saw blade generates silicon dust that falls on the surface of the bonded substrate, resulting in pad corrosion.

In order to remove the silicon dust generated during the cutting (dicing) process, the cutting process relies on the increase of the water flow rate to increase the momentum, however, the rinsing with high water flow rate leads to a dummy pattern fall down, thereby reducing the product yield and performance of the MEMS device.

Thus, there is a need for a method of fabricating a MEMS device that prevents the above-described problems of the prior art.

BRIEF SUMMARY OF THE INVENTION

Embodiments of the present invention relate to a method of manufacturing semiconductor devices, and more particularly to a method of manufacturing a MEMS device without the shortcomings of the prior art.

According to an embodiment, a method for fabricating a MEMS device includes providing a substrate having a front surface and a back surface, and forming a protruding engagement member on the front surface of the substrate. The protruding engagement member has an inner periphery defining a groove and an outer periphery. The method also includes forming a first trench having a first depth along the outer periphery, forming a patterned mask layer on the protruding engagement member covering the groove and exposing a portion of the first trench. The method further includes etching the exposed portion of the first trench to form a second trench having a second depth, removing the patterned mask layer, bonding the substrate with a MEMS substrate to form the MEMS device, and thinning the back surface to within the second depth. The method prevents dust or debris from being deposited on the MEMS substrate as in the case of cutting (sawing, dicing) of the prior art.

In an embodiment, the protruding engagement member is an enclosed structure, which can be annular (circular) shaped, polygonal shaped, elliptical shaped, or a square.

In an embodiment, the second depth of the second trench is greater than the first depth of the first trench.

In an embodiment, the back surface is thinned (reduced) so that the back surface is within the second depth of the second trench.

In an embodiment, forming the protruding engagement member includes forming an oxide layer on the first surface of the substrate, forming a patterned mask on the oxide layer, etching the oxide layer and the substrate using the patterned mask to form an engagement member body, and forming a bonding material layer on the engagement member body.

In an embodiment, the bonding material layer includes germanium.

In an embodiment, the oxide layer has a thickness in the range from 1000 angstroms to 3000 angstroms, and the bonding material layer has a thickness in the range from 4000 angstroms to 6000 angstroms.

In an embodiment, the method further includes forming a metal layer on the surface within the inner periphery and on the outer periphery of the protruding engagement member. In an embodiment, the metal layer includes titanium. The metal layer has a thickness in the range from 2000 angstroms to 4000 angstroms.

In an embodiment, etching the exposed portion of the first trench includes a deep reactive ion etching process using a silicon hexafluoride (SF6) gas, with a RF power to form a high ionization, under a pressure in the range from 20 mTorr to 8 Torr, the power of 600 W, 13.5 MHz, and a DC bias voltage is in the range from 500 V to 1000 V.

Embodiments of the present invention also provide a MEMS device produced by a method including: providing a substrate with a front surface and a back surface, forming a protruding engagement member on the front surface of the substrate, the protruding engagement member having an inner periphery defining a groove, forming a first trench having a first depth along an outer periphery of the protruding engagement member, forming a patterned mask layer on the protruding engagement member covering the engagement member including the groove and exposing a portion of the first trench, etching the exposed portion of the first trench using the patterned mask layer as a mask to form a second trench having a second depth, removing the patterned mask layer, providing a MEMS substrate, and bonding the substrate with the MEMS substrate to form the MEMS device.

In an embodiment, the second depth is greater than the first depth. The back side of the substrate is further thinned so that it is within the second depth.

The method of fabricated a MEMS device according to the present invention does not require dicing so that no dust will fall on the surface of the bonded substrate, leading to pad corrosion.

Furthermore, rinsing with high water flow rate is not required so that no fine pattern can be formed with high aspect ratios without the dummy pattern fall down problems. The method thus has good product yield and high device reliability.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

Figure 1A:
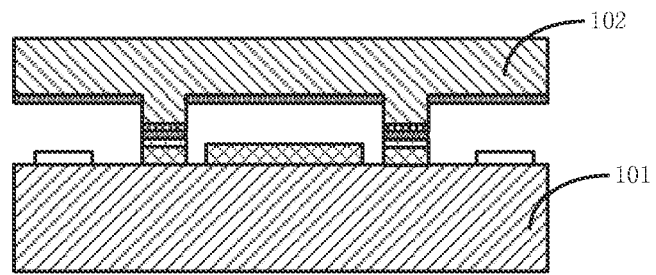
FIG. 1A is a cross-sectional view of an intermediate stage in the manufacturing process of a MEMS device (e.g., a device) of the prior art.
Figure 1B:
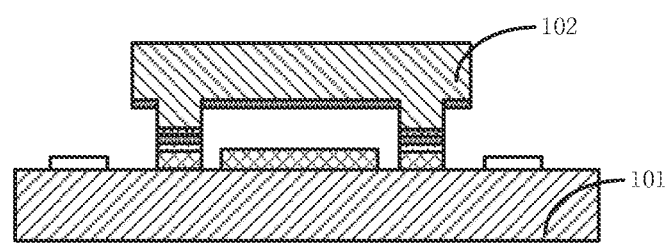
FIG. 1B is a cross-sectional view of the structure in FIG. 1A after dicing the silicon layer of FIG. 1A.
Figure 2A:
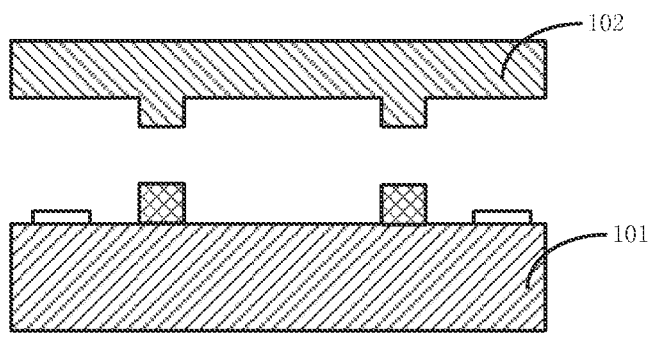
FIGS. 2A-2C are cross-sectional views of stages in the manufacturing process of a MEMS device of the prior art.
Figure 2B:
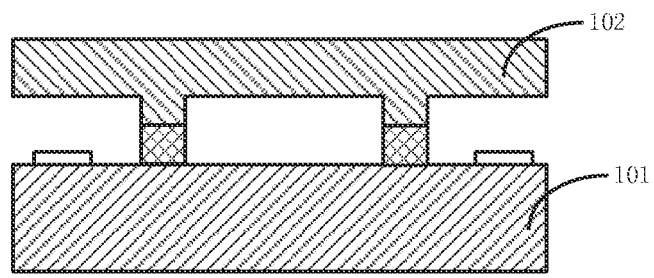
Figure 2C:
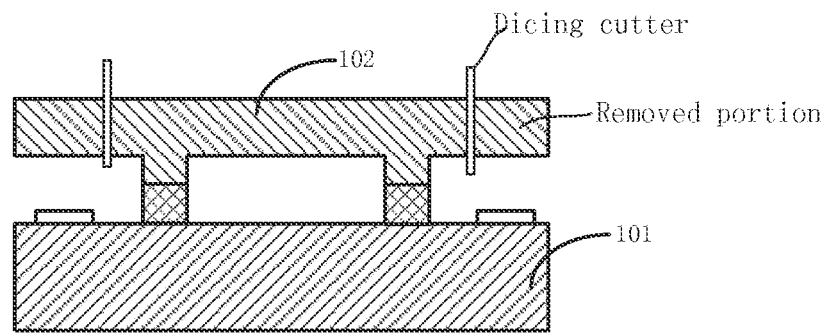

The present invention will be understood more fully from the detailed description given below and from the accompanying drawings of the preferred embodiments of the invention, which, however, should not be taken to limit the invention to the specific embodiments, but are for explanation and understanding only.

It should be understood that the drawings are not drawn to scale, and similar reference numbers are used for representing similar elements. Embodiments of the invention are described herein with reference to cross-section illustrations that are schematic illustrations of idealized embodiments and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because device or components of embodiments of the present invention can be positioned in a number of different orientations (e.g., rotated 90 degrees or at other orientations), the relative terms should be interpreted accordingly.

The terms "substrate" and "wafer" may be used alternatively and may include silicon-on-insulator (SOI) or silicon-on-sapphire (SOS) technology, doped and undoped semiconductors, epitaxial layers of silicon supported by a base semiconductor foundation, and other semiconductor structures. The terms "trench" and "cavity" may be used alternatively herein.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Exemplary Embodiment 1

The present invention provides solutions to prevent the shortcomings of the prior art. Embodiments of the present invention provide a method for manufacturing a MEMS cover layer.

It should be noted that the thus manufactured cover layer may be applied to a variety of MEMS sensing devices such as motion sensors, acceleration sensors, temperature sensors, etc. However, the present invention is not limited to MEMS sensing devices, but can have a much broader applicability such as microphones, RF modules, display devices, and others.

Figure 3A:
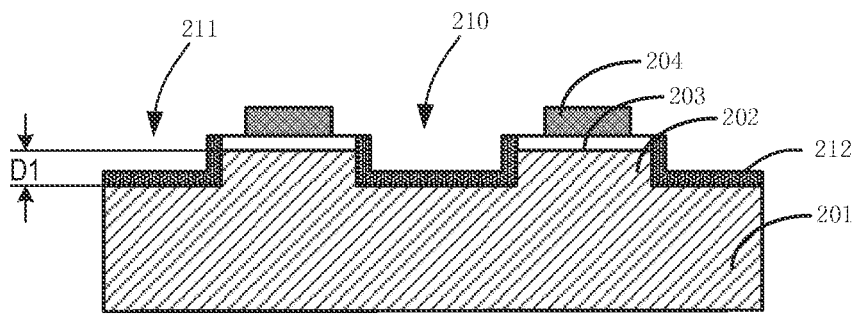
FIG. 3A is a cross-sectional view of an intermediate stage of a semiconductor substrate according to an embodiment of the present invention.
Figure 3B:
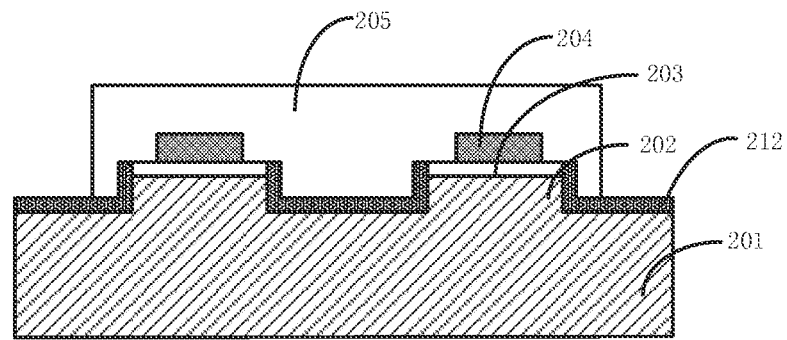
FIG. 3B is a cross-sectional view of an intermediate stage of the semiconductor substrate of FIG. 3A after deposing a patterned mask according to an embodiment of the present invention.
Figure 3C:
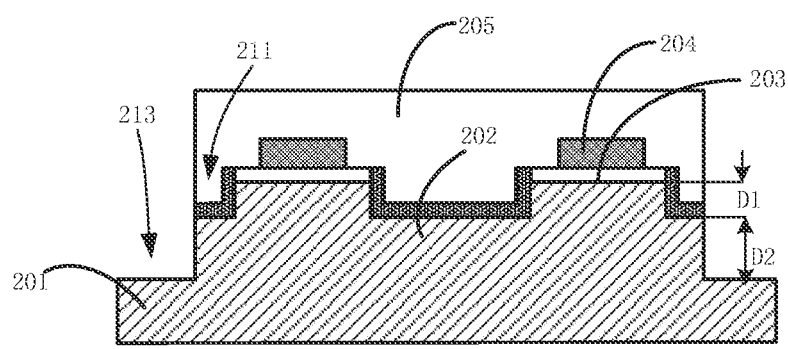
FIG. 3C is a cross-sectional view of an intermediate stage of the semiconductor substrate of FIG. 3B after etching according to an embodiment of the present invention.
Figure 3D:
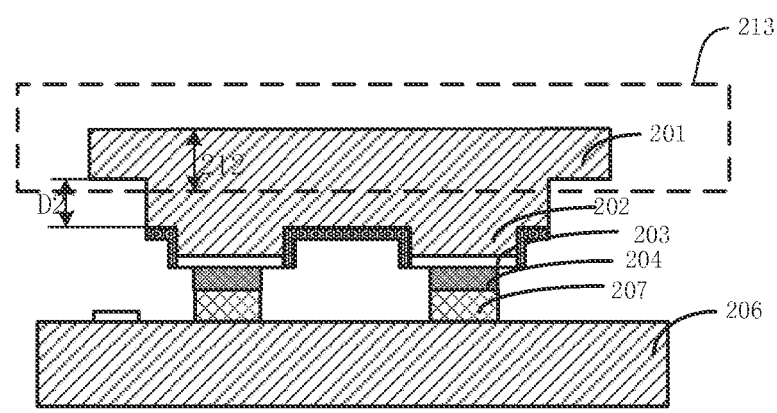
FIG. 3D is a cross-sectional view of a MEMS device before thinning the semiconductor substrate according to an embodiment of the present invention.
Figure 4:
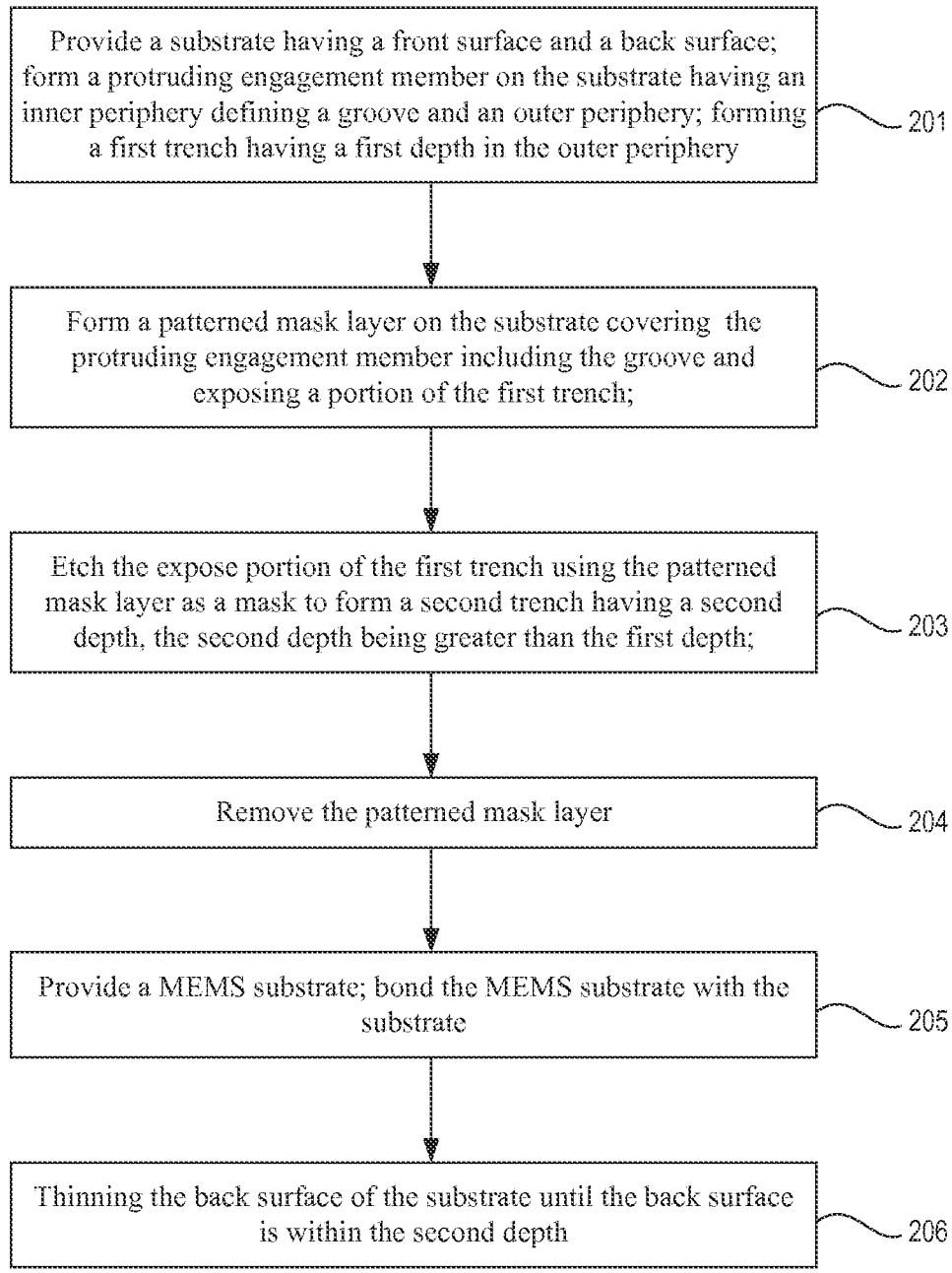
FIG. 4 is a flowchart illustrating a method for manufacturing a MEMS device according to an embodiment of the present invention.

FIG. 4 is a flowchart illustrating a method for manufacturing a MEMS device according to an embodiment of the present invention. Although the method is shown as a sequence of numbered steps for clarity, the numbering does not necessarily impose the order of the steps. Various steps in the method may be better understood in the context of the explanations of FIGS. 3A through 3D. In accordance with the present invention, the method for fabricating a MEMS cover layer may include:

Step 201: a substrate 201 is provided. An engagement member is formed on the substrate. In a specific embodiment, the substrate comprises a semiconductor substrate. The semiconductor substrate may be one of a silicon, polysilicon, and silicon-on-insulator (SOI) material. The engagement member is a protruding structure. In an embodiment, the engagement member is an enclosed structure having an inner periphery and an outer periphery. The enclosed engagement member can have a polygonal shape, a circular shape, an elliptical (oval) shape, a square shape, etc.

In a preferred embodiment, an oxide layer 203 is formed on the semiconductor substrate 201. The oxide layer can be $SiO_2$ and has a thickness from 1000 angstroms to 3000 angstrom, preferably 2000 angstroms.

Next the oxide layer 203 and the semiconductor substrate 201 are submitted to patterning and etching processes to form an engagement member body 202 that is configured to engage with a corresponding MEMS substrate in subsequent steps.

Specifically, the patterning process comprises forming a patterned mask layer on the semiconductor substrate 201, the patterned mask layer can be a patterned photoresist layer or a patterned photoresist stack having a bottom anti-reflective layer and an organic layer. The patterned mask layer has a pattern of the engagement member body 202.

The semiconductor substrate 201 is then etched using the patterned mask layer as a mask to form the engagement member body 202 and a groove 210 that will form a MEMS cavity after engaging the semiconductor substrate 201 with the corresponding MEMS substrate. It is understood that the number of engagement member bodies can be any integer number. In the example shown in FIG. 3A, two engagement member bodies 202 are used. But it is understood that the number is arbitrarily chosen for describing the example embodiment and should not be limiting. The engagement member body is a protruding structure that can have different geometric shapes, such as polygonal (e.g., square) or circular shape.

The groove surrounded by the protruding structure may have a spacing between opposites sides of the inner periphery of the engagement member in the range from 20 um to 40 um, preferably 30 um. If the protruding structure has a square shape, the spacing is the size of the inner side of the square. If the protruding structure has a circular shape, the spacing is the inner diameter of the circle.

In an embodiment, a first trench 211 is formed at the outer periphery of the protruding structure (i.e., the engagement member) with a first depth D1 that is greater than the spacing of the groove.

A bonding material layer 204 is then formed on the engagement member body 202 to form the engagement member configured to engage the semiconductor substrate with the corresponding MEMS substrate. In an embodiment, the bonding material layer 204 has a thickness in the range between 4000 angstroms and 6000 angstroms, and preferably 5000 angstroms.

In an embodiment, the bonding material layer 204 is germanium (Ge).

In a specific embodiment, the critical dimension (width) of the oxide layer 203 is the same as the critical dimension (width) of the engagement member 202 to form a structure having a uniform vertical side surface.

The critical dimension (width) of the bonding material layer 204 is smaller than the critical dimension (width) of the engagement member body 202 to form a step-shaped structure, thereby reducing the contact area of the engagement member on the corresponding MEMS member to improve the integration of the MEMS device.

In a preferred embodiment, a metal layer 212 is formed on the surface of the semiconductor substrate 201, on the surface of the sidewalls of the engagement member 202 and on the surface of the first trench disposed on the outer periphery of the engagement member as a protective layer.

In an embodiment, the metal layer 212 is of titanium (Ti) and has a thickness in the range from 2000 angstroms to 4000 angstroms, preferably 3000 angstroms.

Step 202: forming a patterned mask layer 205 on the substrate 201 covering the engagement member and exposing a portion of the first trench 211.

In an embodiment, the patterned mask layer 205 is deposited on the substrate 201 and is chosen to have an etching selectivity rate greater than that of the substrate 201.

The mask layer 205 is not limited to a particular material. In an embodiment, the mask layer 205 is preferably a photoresist layer to simply the lithographic process and reduce the production cost.

The mask layer 205 is then patterned to expose the metal layer disposed at the two distal ends of the substrate 201, e.g., the distal ends of the first trench.

Step 203: removing the exposed metal layer disposed at two distal ends of the substrate 201 by etching using the patterned mask layer 205 as a mask to form a second trench 213 having a second depth D2 that is greater than the first depth of the first trench.

As shown in FIG. 3C, the second trench in the substrate 201 has a second depth D2 greater than the first depth D1 to provide the substrate with a step-shaped structure.

The exposed metal layer and a portion of the substrate can be removed by dry etching or wet etching. In an embodiment, the exposed metal layer and a portion of the substrate are removed by a deep reactive ion etching (DRIE) process.

In an embodiment, the DRIE process may include a silicon hexafluoride ($SF_6$) gas, with a RF power to form a high ionization; the etching is performed under a pressure in the range from 20 mTorr to 8 Torr, the power of 600 W, 13.5 MHz, the DC bias voltage is in the range from 500 V to 1000 V to ensure an anisotropic etching. The DRIE process can maintain a very high etch selectivity to photoresist.

In an embodiment, the DRIE process is used to form the second trench having a greater second depth.

S204: the mask layer 205 is removed to obtain the engagement member. In an embodiment, the engagement member can be an enclosed circular structure. The mask layer 205 has an etching selectivity rate greater than that of the engagement member and the substrate so that it is can be removed by dry etching or wet etching.

In a preferred embodiment, the mask layer 205 can be removed by ashing.

S205: providing a MEMS substrate and bonding the substrate 201 with the MEMS substrate.

As shown in FIG. 3D, a MEMS substrate 206 is provided. The MEMS substrate 206 comprises MEMS elements and bonding pads 207 formed thereon. The MEMS substrate 206 may include a motion sensor, a pressure sensor, and other sensing devices. In an embodiment, the MEMS substrate 206 includes at least one MEMS element (not shown) and at least one bond pad 207.

Taking the MEMS element having a motion sensor and other components as an example, the method includes providing a substrate and forming a CMOS device in the substrate, the CMOS device may be connected to the MEMS substrate through a metal interconnection structure.

Thereafter, an interlayer dielectric layer is formed on the MEMS substrate, a bottom electrode is formed on the interlayer dielectric layer, a moving piece is formed on the bottom electrode, and conductive connection terminals are formed on both ends of the bottom electrode. Formation of the bottom electrode, the moving piece, and conductive connection terminals can be implemented with convention process techniques, which will not be described herein for the sake of brevity.

Furthermore, bonding pads 207 are formed on distal ends of the MEMS substrate 206. The bonding pads 207 are configured to seal the MEMS device after the silicon substrate and the MEMS substrate are bonded together to achieve the integration of the MEMS device.

In a specific embodiment, the engagement member on the substrate and the conductive connection terminals are connected together. The bonding process can be a eutectic bonding process or a thermal bonding process to form an integral MEMS structure.

In an embodiment, prior to bonding the substrate with the MEMS substrate, the method may also include cleaning the surface MEMS substrate using a diluted hydrofluoric acid (DHF) that includes HF, $H_2O_2$ and $H_2O$ so that the MEMS substrate 206 has a good performance.

In an embodiment, the DHF has a concentration ratio of $HF:H_2O_2:H_2O$ is about 0.1:1:5 to about 1.5:1:5, i.e., the concentration ratio of $HF:H_2O_2:H_2O=(0.1-1.5):1:5$.

S206: the substrate 201 is submitted to a back grinding process to remove a portion having a thickness 212 of the substrate to be within the second depth D2 of the second trench (cavity) and below the first depth D1 of the first trench (cavity) to form the MEMS cover layer, as shown in the dashed-line block 213.

In an embodiment, the substrate 201 can be thinned using a chemical mechanical polishing process, a grinding process, an etching process or a combination thereof.

In step 206, a portion of the substrate 201 is thinned until the substrate reaches within the second depth but before the first depth to form the MEMS cover layer, thereby exposing the bond pad on the MEMS substrate to achieve integration of the MEMS device.

Exemplary Embodiment 2

Embodiments of the present invention also provide a MEMS device that is manufactured using the method described in exemplary embodiment 1.

Embodiments of the present invention further provide an electronic device including the above-described MEMS device. The electronic device may be a MEMS sensor, such as a motion sensor, an accelerator sensor, or the electronic device may include a mobile phone or other equipment.

The present invention provides solutions to solve the problems associated with cutting the MEMS cover substrate using scribing and cutting (blade dicing) of the prior art. In accordance with the present invention, the method includes providing a MEMS cover substrate, forming a patterned mask layer on the MEMS cover substrate, the patterned mask layer exposes the two distal ends of the MEMS cover substrate. The method further includes etching the exposed distal ends of the MEMS cover substrate to form a step-shaped MEMS cover substrate, thinning the back side of the step-shaped MEMS cover substrate by grinding to form a MEMS cover plate. Thus, there is no scribing and blade dicing to avoid dust generated during dicing and the pad corrosion associated with the dust.

The present invention provides many advantages. For example, by avoiding sawing or dicing no dust is generated so that there is no need to clean the wafer using a water stream, that may cause damage or collapse of a pattern on the substrate. There is no pad corrosion since there is no debris or dust falling on the pad as the cutting or dicing process is not required.

FIG. 4 is a flowchart illustrating a method for fabricating a MEMS device. The method includes:

Step 201: providing a substrate, forming a protruding enclosed engagement member on the substrate, the engagement member having an inner periphery defining a groove, and forming a first trench having a first depth along the outer periphery of the engagement member;

Step 202: forming a patterned mask layer on the substrate covering the engagement member including the groove located within the inner periphery while exposing a portion of the first trench;

Step 203: removing the exposed portion of the first trench using the patterned mask layer as a mask to form a second trench having a second depth;

Step 204: removing the patterned mask layer;

Step 205: bonding the substrate with a MEMS substrate;

Step 206: thinning the back surface of the substrate until the back surface of the substrate is within the second depth of the second trench.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for fabricating a MEMS device, the method comprising:

providing a substrate having a front surface and a back surface;

forming a protruding engagement member on the front surface of the substrate, the protruding engagement member having an inner periphery defining a groove;

forming a first trench having a first depth along an outer periphery of the protruding engagement member;

forming a patterned mask layer on the protruding engagement member covering the engagement member including the groove and exposing a portion of the first trench;

etching the exposed portion of the first trench using the patterned mask layer as a mask to form a second trench having a second depth;

removing the patterned mask layer; and bonding the substrate with a MEMS substrate to form the MEMS device.

2. The method of claim 1, wherein forming a protruding engagement member comprises:

forming an oxide layer on the first surface of the substrate;

forming a patterned mask on the oxide layer;

etching the oxide layer and the substrate using the patterned mask to form an engagement member body' forming a bonding material layer on the engagement member body.

3. The method of claim 2, wherein the bonding material layer comprises germanium (Ge).

4. The method of claim 2, wherein the oxide layer has a thickness in a range from 1000 angstroms to 3000 angstroms, and the bonding material layer has a thickness in a range from 4000 angstroms to 6000 angstroms.

5. The method of claim 1, further comprising, prior to forming the second trench:
forming a metal layer on a sidewall surface of the protruding engagement member and on a surface of the first trench.

6. The method of claim 5, wherein the metal layer comprises titanium (Ti).

7. The method of claim 5, wherein the metal layer has a thickness in a range from 2000 angstroms to 4000 angstroms.

8. The method of claim 1, wherein etching the exposed portion of the first trench comprises a deep reactive ion etching process using a silicon hexafluoride ($SF_6$) gas, with a RF power to form a high ionization, under a pressure in the range from 20 mTorr to 8 Torr, the power of 600 W, 13.5 MHz, and a DC bias voltage is in the range from 500 V to 1000 V.

9. The method of claim 1, wherein the protruding engagement member is an enclosed structure.

10. The method of claim 9, wherein the enclosed structure has an annular shape.

11. The method of claim 9, wherein the enclosed structure has a polygonal shape.

12. The method of claim 9, wherein the enclosed structure has a square shape.

13. The method of claim 1, further comprising:
thinning the back surface so that the back surface is within the second depth of the second trench.

14. The method of claim 13, wherein thinning the back surface comprises grinding.

15. The method of claim 13, wherein thinning the back surface comprises etching.

16. The method of claim 1, wherein the second depth is greater than the first depth.

* * * * *